US007556405B2

(12) United States Patent
Kingsford et al.

(10) Patent No.: US 7,556,405 B2
(45) Date of Patent: Jul. 7, 2009

(54) MOUNTING LIGHT EMITTING DIODES

(75) Inventors: Howard A. Kingsford, Amherst, NH (US); Kristel L. Ferry, Methuen, MA (US); William P. Clune, Hillsborough, NH (US); Mark A. Clarner, Concord, NH (US); Bryan H. Blackmon, Hooksett, NH (US)

(73) Assignee: Velcro Industries B.V., Curacao (AN)

(*) Notice: Subject to any disclaimer, the term of this patent is extended or adjusted under 35 U.S.C. 154(b) by 0 days.

(21) Appl. No.: 11/495,043

(22) Filed: Jul. 28, 2006

(65) Prior Publication Data

US 2007/0025108 A1 Feb. 1, 2007

Related U.S. Application Data

(60) Provisional application No. 60/703,330, filed on Jul. 28, 2005.

(51) Int. Cl.
*F21V 29/00* (2006.01)

(52) U.S. Cl. ....................... 362/294; 362/249; 362/391; 362/800; 361/600; 361/739; 361/807; 361/809; 361/704

(58) Field of Classification Search ................. 362/294, 362/362, 800, 249; 361/600, 739, 800, 809, 361/704
See application file for complete search history.

(56) References Cited

U.S. PATENT DOCUMENTS

| | | | | |
|---|---|---|---|---|
| 3,857,397 | A | 12/1974 | Brosseau | |
| 4,164,008 | A | 8/1979 | Miller et al. | |
| 4,281,211 | A | 7/1981 | Tatum et al. | |
| 4,602,191 | A | 7/1986 | Davila | |
| 4,709,307 | A | 11/1987 | Branom | |
| 4,794,028 | A | 12/1988 | Fischer | |
| 5,260,015 | A | 11/1993 | Kennedy et al. | |
| 5,310,964 | A | 5/1994 | Roberts et al. | |
| 5,455,749 | A | 10/1995 | Ferber | |
| 5,492,580 | A | 2/1996 | Frank | |
| 5,550,408 | A * | 8/1996 | Kunitomo et al. | 257/737 |
| 5,569,549 | A | 10/1996 | Redford | |
| 5,716,574 | A | 2/1998 | Kawasaki | |
| 5,744,080 | A | 4/1998 | Kennedy et al. | |
| 5,763,112 | A | 6/1998 | Redford | |
| 5,836,673 | A | 11/1998 | Lo | |
| 5,945,193 | A | 8/1999 | Pollard et al. | |
| 6,036,259 | A | 3/2000 | Hertel et al. | |
| 6,106,303 | A | 8/2000 | Wojewnik | |

(Continued)

FOREIGN PATENT DOCUMENTS

EP 0813277 12/1997

(Continued)

*Primary Examiner*—Sandra L O'Shea
*Assistant Examiner*—Jessica L McMillan
(74) *Attorney, Agent, or Firm*—Fish & Richardson P.C.

(57) ABSTRACT

A flexible circuit has a roll-molded thermoplastic resin base sheet with an integrally molded mounting structure located to receive a light emitting diode device in an illuminating position. The mounting structure is a pin receptacle constructed to receive a pin of the light emitting diode device. An electrically conductive portion is carried by the resin base and positioned for electric connection to conductors of the device. Another flexible circuit carries discrete integrated circuit chips and a field of fastener elements extending from a surface of a resin strip carrying conductive traces interconnecting the chips.

16 Claims, 16 Drawing Sheets

U.S. PATENT DOCUMENTS

| | | | | |
|---|---|---|---|---|
| 6,210,771 | B1 | 4/2001 | Post et al. | |
| 6,395,121 | B1 | 5/2002 | De Bastiani | |
| 6,402,336 | B1 | 6/2002 | Reese | |
| 6,640,434 | B1 | 11/2003 | Wojewnik et al. | |
| 6,668,380 | B2 | 12/2003 | Marmaropoulos et al. | |
| 6,697,262 | B2 | 2/2004 | Adams et al. | |
| 6,880,955 | B2 * | 4/2005 | Lin | 362/249 |
| 6,977,055 | B2 | 12/2005 | Gallant et al. | |
| 2002/0039290 | A1 | 4/2002 | Lemmens | |
| 2003/0179548 | A1 | 9/2003 | Becker | |
| 2004/0016565 | A1 * | 1/2004 | Gallant et al. | 174/117 F |
| 2004/0037079 | A1 | 2/2004 | Luk | |
| 2004/0131823 | A1 | 7/2004 | Rodgers et al. | |
| 2004/0262029 | A1 | 12/2004 | McConville et al. | |
| 2005/0098454 | A1 | 5/2005 | Gallant et al. | |
| 2005/0116667 | A1 * | 6/2005 | Mueller et al. | 315/312 |
| 2005/0186387 | A1 | 8/2005 | Gallant et al. | |
| 2006/0050492 | A1 * | 3/2006 | Goodwin et al. | 361/767 |
| 2007/0003773 | A1 * | 1/2007 | Uhara | 428/473.5 |

FOREIGN PATENT DOCUMENTS

| | | |
|---|---|---|
| EP | 1473978 | 11/2004 |
| GB | 2256977 | 8/1991 |
| JP | 200129433 | 10/1991 |
| WO | WO 02/35672 | 5/2002 |
| WO | WO 2004/030994 | 4/2004 |

* cited by examiner

MOUNTING LIGHT EMITTING DIODES

CROSS REFERENCE TO RELATED APPLICATIONS

This application claims the benefit of U.S. Provisional Patent Application No. 60/703,330, filed Jul. 28, 2005, which is incorporated herein by reference in its entirety.

TECHNICAL FIELD

This invention relates to electrical components, and more particularly to mounting light emitting diode devices on flexible circuits.

BACKGROUND

Light emitting diodes can be mounted on flexible circuits to provide both decorative and commercial lighting displays. The flexible circuits provide mechanical support as well as control signals and electrical power to the mounted light emitting diodes. Such flexible circuits and mounted light emitting diodes can be attached to supporting structures by permanent or releasable fastening means.

There is a need for more efficient and less costly methods of producing circuits for mounting light emitting diodes and other discrete electrical components. Such circuits are needed that are heat resistant, easy to use, and capable of providing flexibility in configuration.

SUMMARY

In one aspect of the invention, a flexible circuit for a lighting installation includes a roll-molded thermoplastic resin base sheet having an integrally molded mounting structure located to receive a light emitting diode device in an illuminating position, the mounting structure including pin receptacles constructed to receive pins of the light emitting diode device. The flexible circuit also includes an electrically conductive portion carried by the resin base, the electrically conductive portion positioned for electric connection to conductors of the device.

In another aspect of the invention, a flexible circuit includes a roll-molded thermoplastic resin base sheet having an integrally molded mounting structure located to receive a electrical device, the mounting structure including pin receptacles constructed to receive pins of the electrical device. The flexible circuit also includes an electrically conductive portion carried by the resin base, the electrically conductive portion positioned for electric connection to conductors of the device.

In some embodiments, the flexible circuit includes a heat management system associated with the resin base sheet and arranged to conduct heat from the base of the device. For example, in some flexible circuits, heat management system includes molded standoffs integral with the base defining air passages for convective heat transfer. In another example, in some flexible circuits, the heat management system includes a thermal conductive portion exposed for engagement by the light emitting diode device for conductive heat transfer. In some cases, the thermal conductive portion includes a phase change material. In another example, in some flexible circuits, the resin base sheet includes additives, such as titanium nitride, boron nitride, silica, aluminum oxide, and ceramic particles, that increase the thermal conductivity of the resin base sheet. In some flexible circuits, the heat management system includes radiative structures including material with a high thermal conductivity in contact with the light emitting diode device. In some embodiments, the heat management system includes a peltier junction with a hot-side of greater surface area than an associated cold side. In some cases, the resin base sheet includes a resin that preserves a thermoformed shape for temperatures up to 85 degrees Centigrade.

In some embodiments, the mounting structure includes device receptacles integrally molded with and extending from the base, the receptacles sized to receive and engage the diode devices. In some cases, the device receptacle is a protrusion having pin-receiving passages extending to one of the conductors in the flexible circuit. In some other embodiments, the mounting structure is defined by a device receptacle integrally molded with and extending into the base, the receptacle sized to receive and engage the diode device.

In some embodiments, the pin receptacles have an adhesive coating. In some flexible circuits, the pin receptacles have a cross-sectional geometry that is different than an outer surface of the pins they are constructed to receive.

In some embodiments, the electrically conductive portions are exposed on a surface of the resin sheet base. In some other embodiments, the electrically conductive portions are encapsulated within the base.

In some embodiments, some flexible circuits also include a clamping connector that pierces the resin base sheet to electrically connect the flexible circuit to an electrical source and a ground. In some cases, so flexible circuits also include voids extending through resin base sheet to the electrically conductive portions. For example, in some cases, the voids are coated with an electrically conductive material.

In some embodiments, some flexible circuits also include touch fastener elements attached to the resin basin sheet. For example, in some flexible circuits, the touch fastener elements include male fastener elements with engageable heads. In some fastener products, the touch fastener elements are arranged in a longitudinally continuous field of touch fastener elements extending along the base. In another example, in some flexible circuits, the touch fastener elements include loop-material in situ laminated to the resin base sheet.

In some embodiments, the flexible circuit is a longitudinally extending flexible circuit with multiple mounting structures. For example, in some flexible circuits, the electrically conductive portion is arranged in a pattern such that, when the base is severed between mounting structures to create a strip of a desired, finite length between severed ends, the electrically conductive conductors provide an electrical connection from the severed ends to mounting structures. In some cases, the flexible circuit also includes touch fastener elements exposed along the base and arranged such that the individual strips each have some of the touch fastener elements exposed for releasably mounting the strip to a support surface.

In another aspect of the invention, a lighting assembly includes a light-emitting device; and a mounting including a combination of a thermoplastic flexible circuit and a heat-conducting system. The flexible circuit has electrical conductors electrically connected to conductive pins of the device and the heat-conducting system in heat-transfer relationship with a heat sink of the device, the heat-conducting system arranged to conduct heat to a heat-dispersion location situated beyond the thermoplastic flexible circuit.

In some embodiments, the light emitting device includes a light-emitting device diode module including a diode chip disposed on and in heat-transfer relationship to a central heat sink. In some cases, the lighting assembly is elongated and includes multiple spaced-apart diode modules, the flexible circuit extending along the length of the assembly and the modules having mounting pins inserted into the body of the flexible circuit, the modules in electrical contact with conductors of the circuit.

In some embodiments, the heat conducting system includes at least one heat-transfer plate extending from face-to-face contact with the heat sink to a heat-dispersive location situated laterally beyond the diode module. In some cases, the heat conducting system has an upstanding heat-transfer flange situated beyond and alongside the light-emitting diode module. In some embodiments, the heat conducting system includes a pair of oppositely directed “L” cross-section metal channels. In some embodiments, the heat conducting system includes a peltier cooling system including a relatively cold section in heat-transfer relationship with the heat sink of the light-emitting diode module and a relatively hot section larger in dimension than the cold section situated beyond the thermoplastic flexible-circuit.

In some embodiments, the heat conducting system includes a thermal conductor of solid material defining an internal fluid-tight cavity containing a heat-transfer substance positioned to enhance heat-transfer from the heat sink. In some cases, the heat transfer substance is a heat transfer liquid. In other cases, the heat transfer substance is a heat transfer wax. In still other cases, the heat transfer substance is a heat transfer phase change material (e.g., a phase change material that includes Glauber’s salt).

In some embodiments, the light emitting diodes have a normal operating temperature of less than about 85 degrees Centigrade.

In some embodiments, the light emitting device generates visible light.

In another aspect of the invention, a method of manufacturing a flexible circuit for a lighting device includes introducing moldable resin into a gap adjacent a rotating mold roll such that the resin forms a continuous strip-form base and mounting structures, the mounting structures supported by the base and molded to receive a light emitting diode device in an illuminating position; attaching an electrically conductive portion to the base, the electrically conductive portion positioned for electric connection to conductors of the device; and providing a heat management system supported by the resin base sheet, the heat management system arranged to conduct heat from the device.

In some embodiments, the receptacles extend outward from a generally planar surface of the base. In other embodiments, the receptacles include cavities defined in the base.

In some embodiments, the method also includes adding conductive material to the receptacles.

In some embodiments, the method also includes attaching a series of light emitting diode devices to the strip-form base. In some cases, attaching the series of lights includes, after striping the solidified resin from the mold roll, placing light emitting diodes having pins into the receptacles, for example, inserting the pins into holes defined in the receptacles such that the pins contact the conductors. In another example, placing the light emitting diodes includes preheating the pins to a temperature above the melting point of the resin and inserting the pins into the resin layer such that the pins contact the conductors. In some cases, attaching the series of lights includes laminating the series of lights to the resin layer. In some cases, attaching the series of lights includes heating the resin layer before introducing the resin layer and associated molded stems into a lamination nip a flexible strip of lights.

In some embodiments, the method also includes forming a field of molded stems. In some cases, forming the field of molded stems includes: introducing moldable resin into a gap adjacent to a rotating mold roll, such that the resin fills an field of fixed cavities defined in the mold roll to form the field of molded stems; forming engageable heads on the molded stems; solidifying the resin; and then stripping the solidified resin from the peripheral surface of the mold roll by pulling the projections from their respective cavities. In other cases, forming the field of molded stems includes: providing a mold with a first mold part having a mold surface with a region having an array of fastener element cavities extending therefrom for molding the fastener elements, and a second mold part having a mold surface aligned with the mold surface of the first mold part to define therebetween, in a closed condition, a mold cavity constructed to receive molten plastic for molding the product; substantially filling the mold cavity with molten resin; and opening the mold to remove a molded product with a field of molded stems.

In some embodiments, the method also includes spooling onto spool.

In some embodiments, the method also includes separating the continuous strip-form base into discrete lights strips of a desired length, each light strip including mounting structures.

Such methods can provide for efficient, cost effective production of circuits for mounting light emitting diode devices. The circuits themselves can feature mounting and/or heat management structures that can provide advantages including ease of attachment and improved heat transfer. Produced in continuous strip form, the circuits can provide flexibility in lighting strip configuration.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
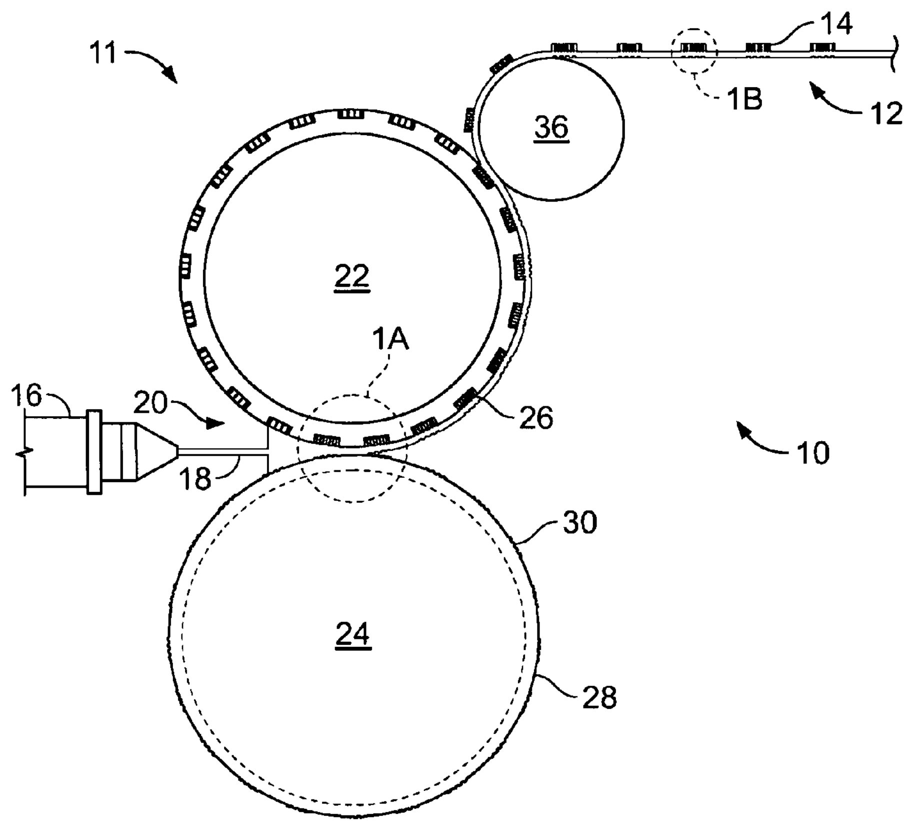
FIG. 1 is a schematic side view of a portion of a manufacturing system used to produce a flexible circuit.
Figure 1A:
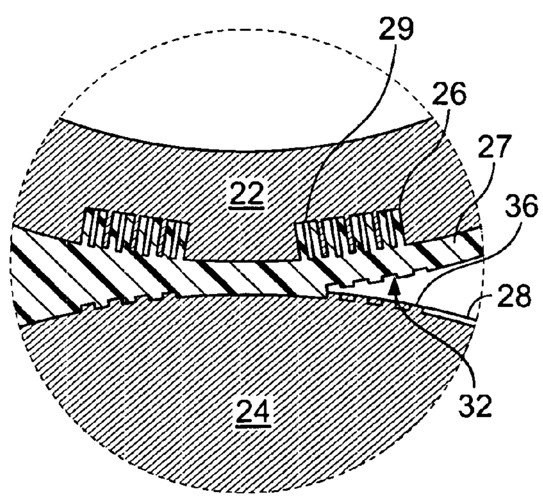
FIG. 1A is a cross-sectional view of the nip of the manufacturing system shown in FIG. 1.
Figure 1B:
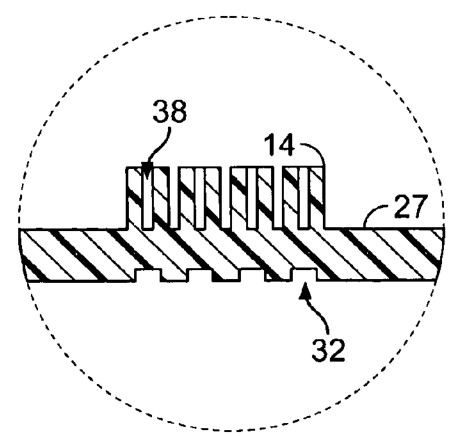
FIG. 1B is a cross-sectional view of the flexible circuit shown in FIG. 1, taken along the circuit’s centerline, before conductive traces are added.

Referring to FIGS. 1-1B, a manufacturing system 10 produces a flexible circuit 12 with mounting structures 14 configured to receive and support light emitting diode devices. In a preferred form, the system employs roll molding apparatus 11 of the general type shown in U.S. Pat. No. 4,872,243 issued to Fisher. An extruder 16 feeds molten resin 18 into a nip 20 defined between a mold roll 22 and a counter-rotating pressure roll 24. Mold roll 22 has a field of small mold cavities 26 extending into its peripheral surface. Each mold cavity 26 is a cylindrical annulus with a central pillar 29. Mold cavities 26 are shaped to form mounting structures 14 extending from a resin base 27. Similarly, an outer surface 28 of pressure roll 24 includes structural features 30 configured to shape shallow channels 32 in resin base 27, the shallow channels on the opposite side of the resin base from mounting structures 14.

After passing through nip 20, the thermoplastic continues on the surface of rotating temperature-controlled (cooled) mold roll 22 until the resin is sufficiently cooled to enable removal from the mold roll by a stripping roll 36.

In this embodiment, manufacturing system 10 produces flexible circuit 12 with mounting structures 14 configured to receive eight-pin light emitting diodes. Thus, sets of eight mounting structures 14 are arranged in two parallel rows of four closely spaced mounting structures. Linear spacing between sets of mounting structures 14 is determined by the desired linear spacing between light emitting diodes in a final product. Although not apparent from these drawings, this roll molding apparatus produces a sheet comprising multiple flexible circuits 12 side-by-side along the width of the roll molding apparatus 11.

Each mounting structure 14 is a substantially cylindrical structure with a bore 38 extending from an opening at the upper end of the mounting structure towards resin base 27. Bores 38 are separated from channels 32 by thin portions of base 27. Bores 38 are sized and configured to receive the pins of a light emitting diode device. In this embodiment, bores 38 have circular cross-sections but the resin of mounting structures 14 is sufficiently deformable that the mounting structures can receive rectangular pins whose width is approximately equal to or slightly greater than the diameter of the bore. As mounting structures 14 flex to receive the pins, the mounting structures also frictionally engage the pins so as to help hold the pins in place after they are inserted. In some embodiments, the interior surfaces of the bores are also coated with an adhesive to help hold the pins in place after they are inserted.

Figure 1C:
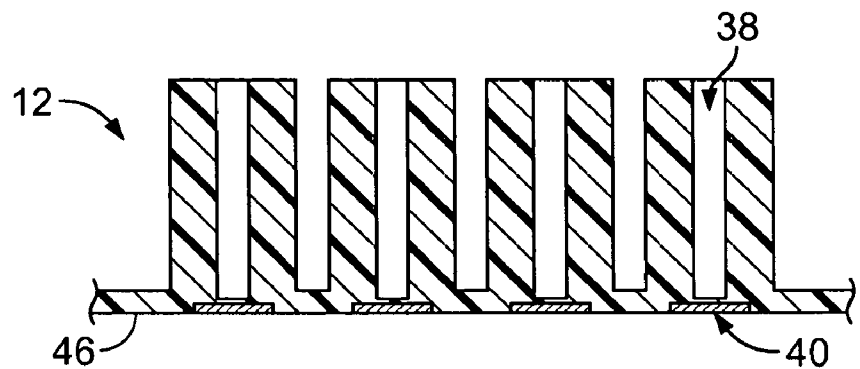
FIG. 1C is a cross-sectional view of the flexible circuit shown in FIG. 1, taken along the circuit’s centerline, after conductive traces are added.
Figure 1D:
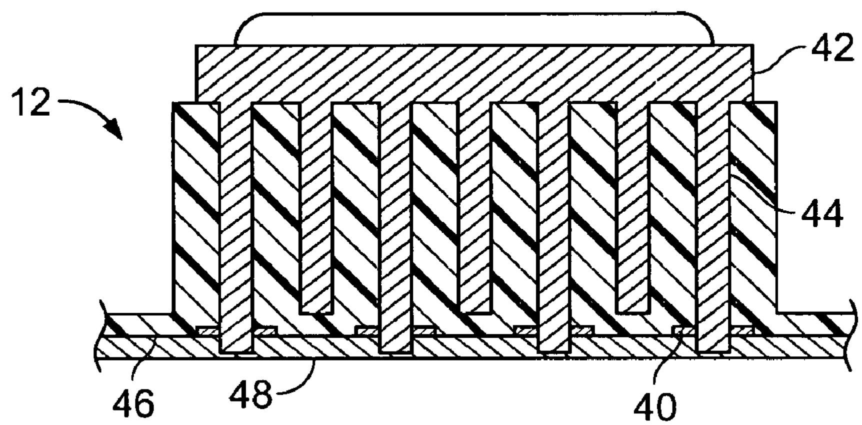
FIG. 1D is a cross-sectional view of the flexible circuit shown in FIG. 1, taken along the circuit’s centerline, with a light emitting diode device attached.
Figure 1E:
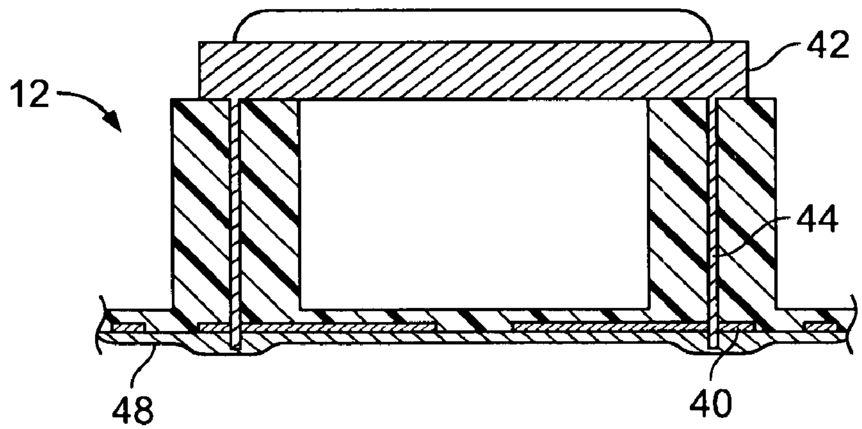
FIG. 1E is a cross-sectional view of the flexible circuit shown in FIG. 1, taken perpendicular to the circuit’s centerline, with a light emitting diode device attached.

Referring to FIGS. 1C-1E, channels 32 are subsequently filled, as is described in more detail below, with electrically conductive material 40. Light emitting diode devices 42 are installed onto flexible circuit 12 by inserting pins 44 through bores 38 to pierce resin base 27 and electrically conductive material 40. Mounting structures 14 are thought to increase the lateral stability of the pins as the pins are inserted, thus allowing more force to be applied to the tips of the pins as they are inserted. An insulative layer 48 is subsequently applied to back side 46 of the circuit covering both electrically conductive material 40 and the exposed portions of pins 44.

In an alternate embodiments, the pins include structural features (reverse barbs on the pin tips, projections extending laterally from pin sides, or an adhesive applied to an outer surface of the pins) configured to enhance pin retention in the bore and/or electrical contact between the pin in the conductive material.

In addition to providing structural support to the light emitting diode devices, mounting structures 14 separate the ceramic bodies of the light emitting diode devices from resin base 27 of flexible circuit 12. This separation allows for air circulation under the light emitting diode devices. Such circulation is thought to have a cooling effect that advantageously reduces the likelihood of heat damage to either the light emitting diode device or the resin base. In some embodiments, this effect is enhanced by additives (e.g. titanium nitride, boron nitride, silica, aluminum oxide, or ceramic particles) incorporated into the resin to increase the thermal conductivity of resin base sheet 27.

Figure 2A:
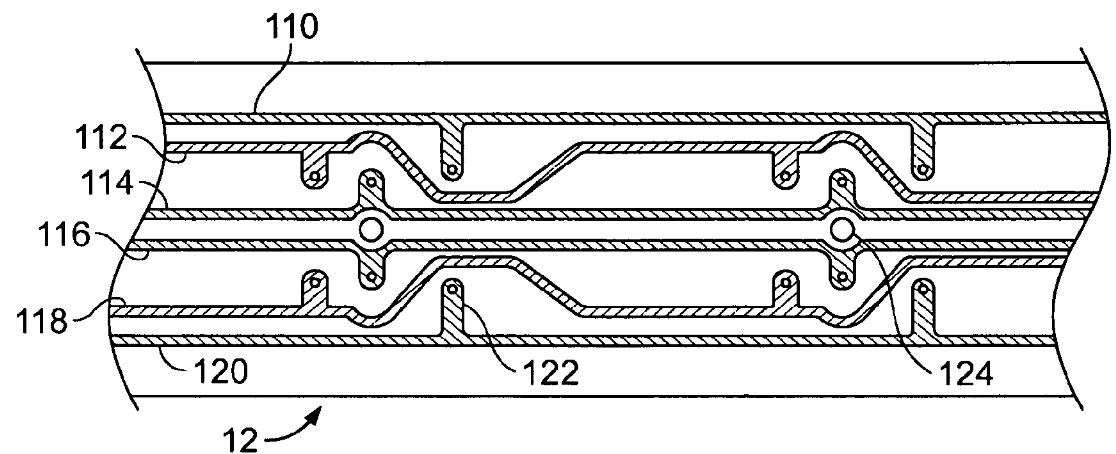
FIG. 2A is a plan view of the conductive traces of the flexible circuit shown in FIG. 1.

Referring to FIG. 2A, the strip of flexible circuit 12 is configured with six conductive traces 110, 112, 114, 116, 118, 120 to receive and operate six-pin light emitting diode devices. Outer traces 110, 120 provide the power and ground lines, respectively. Inner traces 112, 114, 116, 118 provide the input and output lines used to control and operate light emitting diode devices mounted on flexible circuit 12. Passes 122 are positioned to correspond with the spacing of the pins of six-pin light emitting diode devices. Optionally, holes 124 are included to receive heat sinks associated with the light emitting diode devices.

Because the conductive traces are arranged in a repeating pattern, the base can be severed between adjacent sets of mounting structures 14 to create strips of a desired finite length. In such embodiments, the conductive traces electrically connect the severed ends of the finite strip to light emitting diode devices at the mounting structures along the length of the strip. Consequently, pressure roll 24 can be assembled from multiple rings, each ring including structural features 30 configured to shape shallow channels 32 in the desired repeating pattern.

Figure 2B:
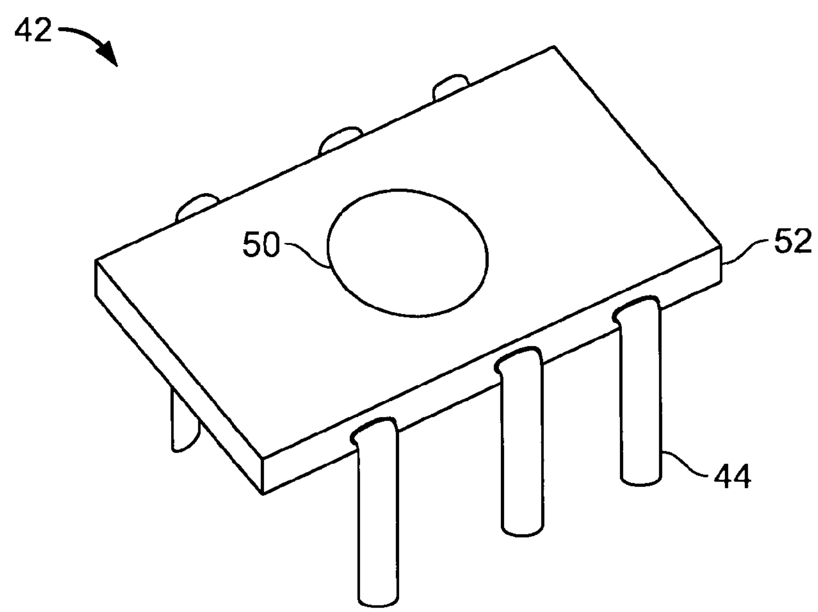
FIG. 2B is a perspective view of a light emitting diode device.

Referring to FIG. 2B, a six-pin light emitting diode device 42 has a light emitting diode 50 embedded in a ceramic body 52 with 6 pins 44 extending from the ceramic body. Such light emitting diode devices are commercially available in a variety of configurations (e.g. six-pin, eight-pin, or twelve-pin). Ceramic body 52 typically contains a heat sink (not shown) to transfer heat away from the light emitting diode. Pins 44 are configured to physically attach and electrically connect light emitting diode device 42 to a circuit for use.

Figure 3:
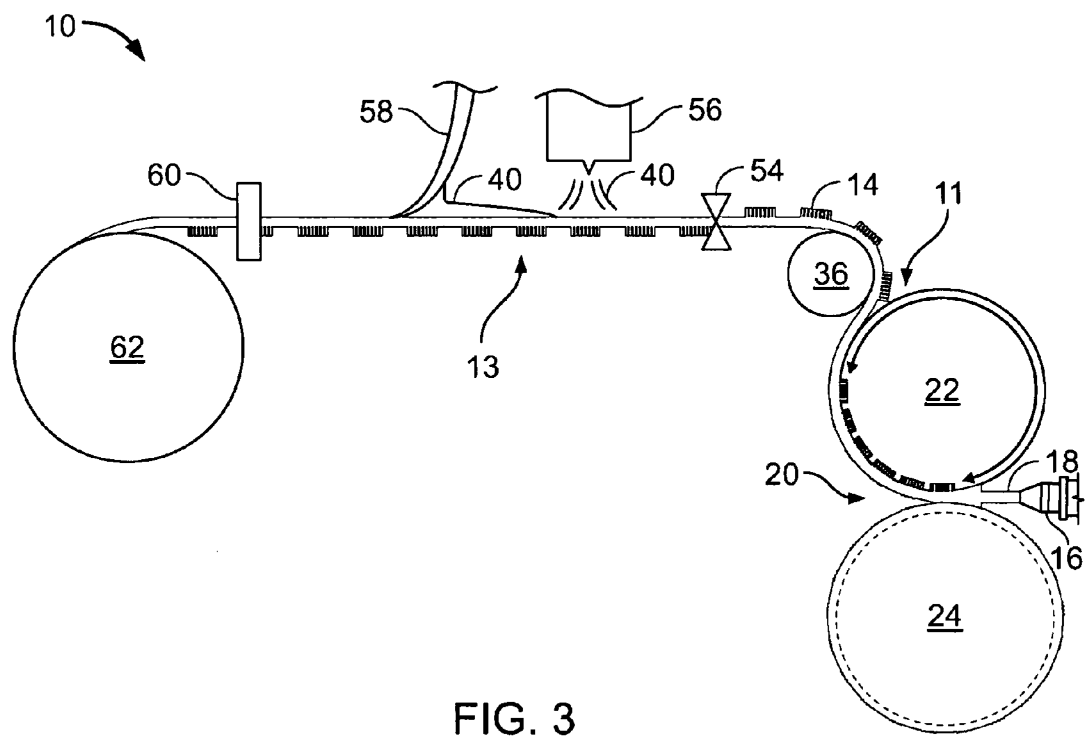
FIG. 3 is a schematic side view of an alternate embodiment of the manufacturing system shown in FIG. 1.

Referring to FIG. 3, a similar manufacturing system 10 includes a roll molding apparatus 11, a filling station 13, and a storage apparatus 15. As also shown in FIG. 1, roll molding apparatus 11 includes extruder 16, mold roll 22, pressure roll 24, and stripping roll 36. Stripping roll 36 removes the resin base 27 from mold roll 22 and feeds the resin base to an inverter 54. Inverter 54 reverses the orientation of the resin base 27 so that the channels, defined in the back side of the base, face upwards as the base proceeds through filling station 13.

Filling station 13 includes a dispenser 56 and a doctor blade 58. Dispenser 56 sprays quick-drying conductive ink 40 onto the face of resin base 27 where the channels are defined. Conductive ink 40 fills the channels and accumulates on the face of resin base 27. Doctor blade 58 wipes the accumulated ink from the face of the resin base while leaving ink in the channels where it dries and solidifies to form conductive traces on the resin base as the resin base proceeds to storage apparatus 15.

In some embodiments, a mask between dispenser 56 and resin base 27 limits the spray of conductive ink 40 to specific areas of the resin base. This reduces or eliminates the need for doctor blade 58 to wipe resin base 27. In some embodiments, similar methods are used to apply material that forms a base upon which additional conductive material is electroplated to form the conductive traces rather than the sprayed material directly forming the conductive traces.

Storage apparatus 15 includes slitter 60 and storage rolls 62. As discussed above, the roll molding apparatus produces a sheet comprising multiple, continuous strips of flexible circuits 12 side-by-side along the width of the roll molding apparatus. Slitter 60 cuts the sheet to separate individual, continuous strips of flexible circuits 12 from each other before the individual strips of flexible circuits are stored on storage rolls 62. A similar system can be used to produce a single (rather than multiple) continuous strip of flexible circuits. In an alternate embodiment, slitter 60 is omitted and the multiple continuous strips of flexible circuits are stored in the form of a single sheet for later processing.

The storage rolls 62 are primarily useful for the storage of flexible circuits without light emitting diode devices attached. Once attached, light emitting diode devices are likely to cause uneven surfaces which are problematic for attempts to spool the flexible circuit onto a storage roll 62. Similar problems can occur for circuits with relatively tall mounting structures.

Figure 4A:
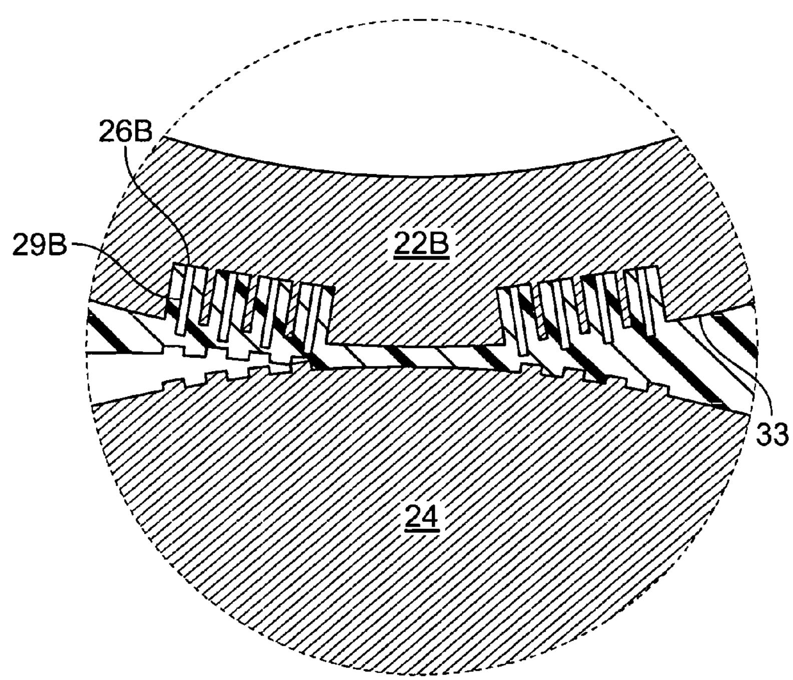
FIG. 4A is a cross-sectional view of the first nip of the manufacturing system shown in FIG. 4.
Figure 4:
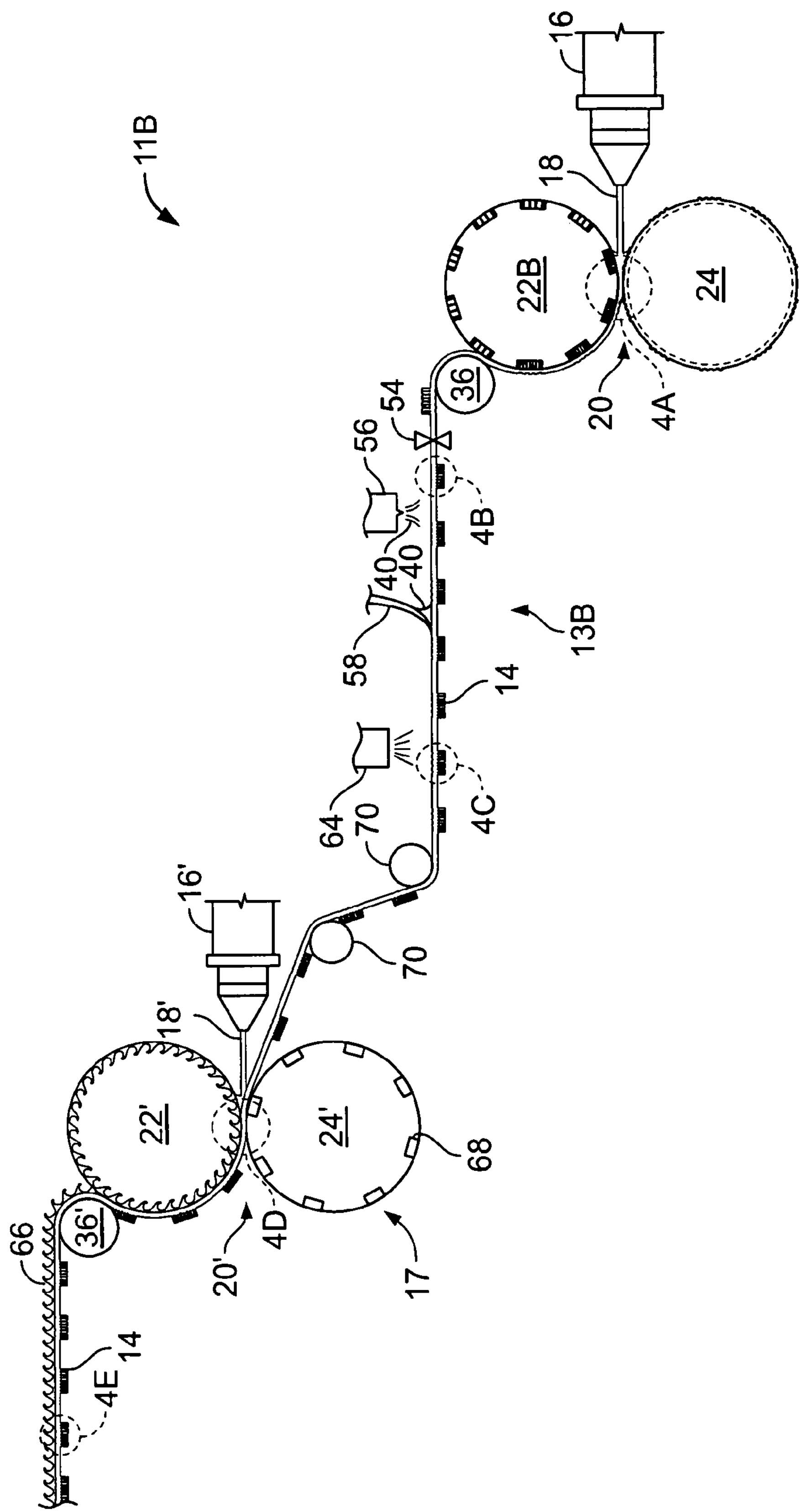
FIG. 4 is a schematic side view of another alternate embodiment of the manufacturing system shown in FIG. 1.
Figure 4B:
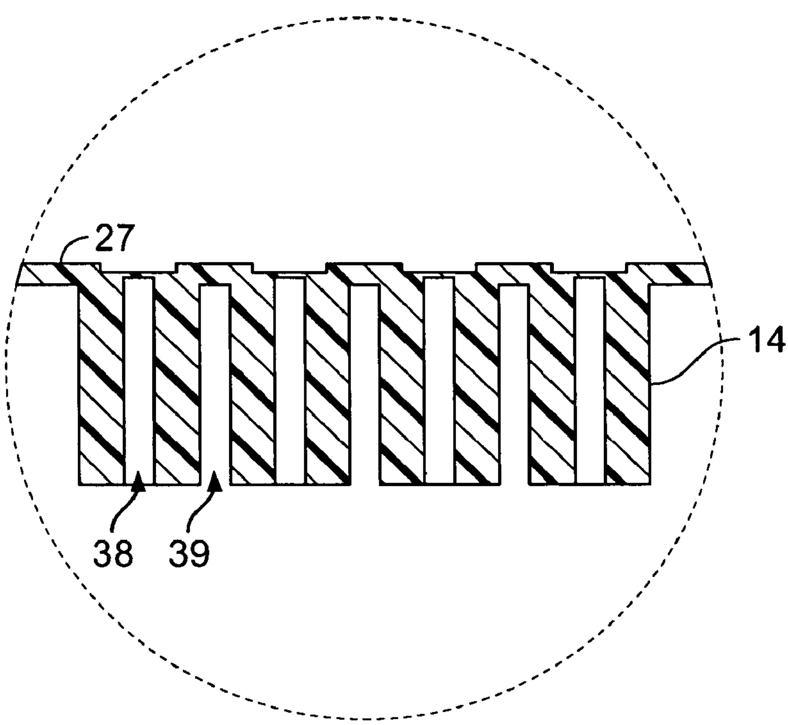
FIG. 4B is a cross-sectional view of the flexible circuit shown in FIG. 4, taken along with the circuit’s centerline, before conductive traces are added.
Figure 4C:
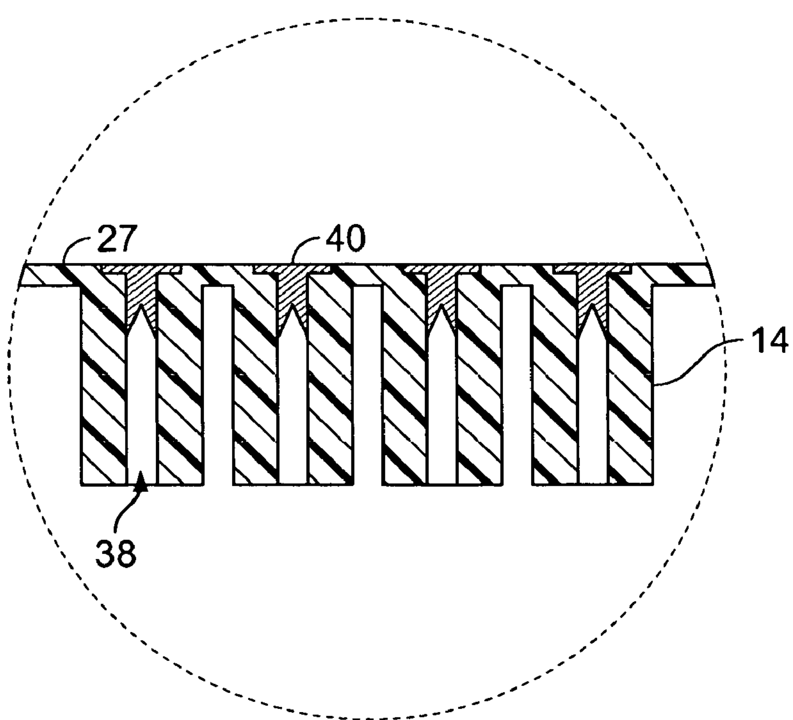
FIG. 4C is a cross-sectional view of the flexible circuit shown in FIG. 4, taken along with the circuit’s centerline, after conductive traces are added.
Figure 4D:
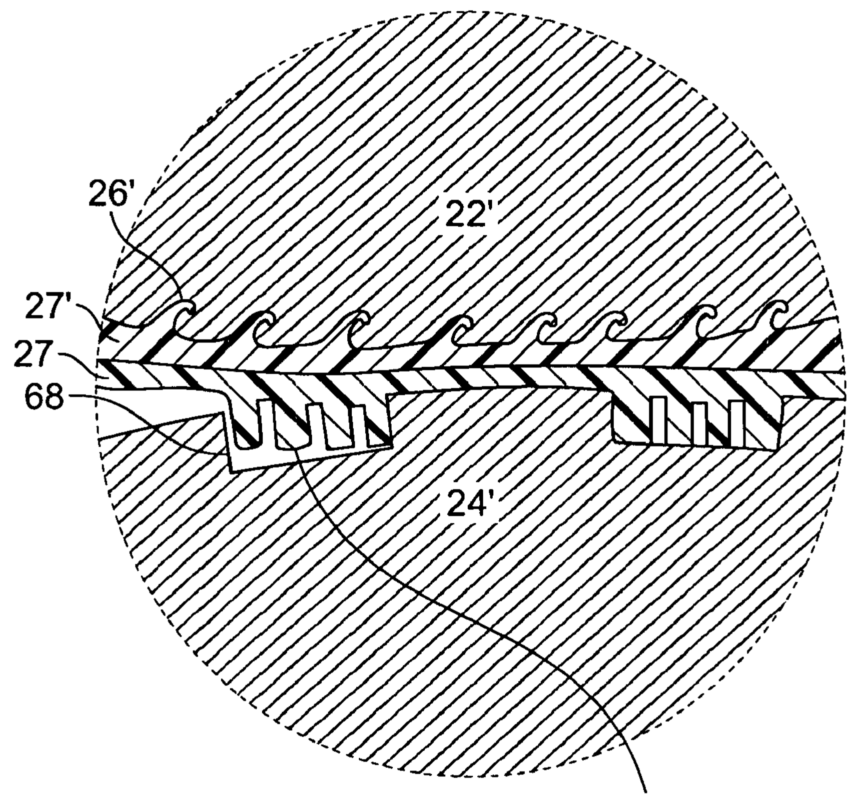
FIG. 4D is a cross-sectional view of the second nip of the manufacturing system shown in FIG. 4.
Figure 4E:
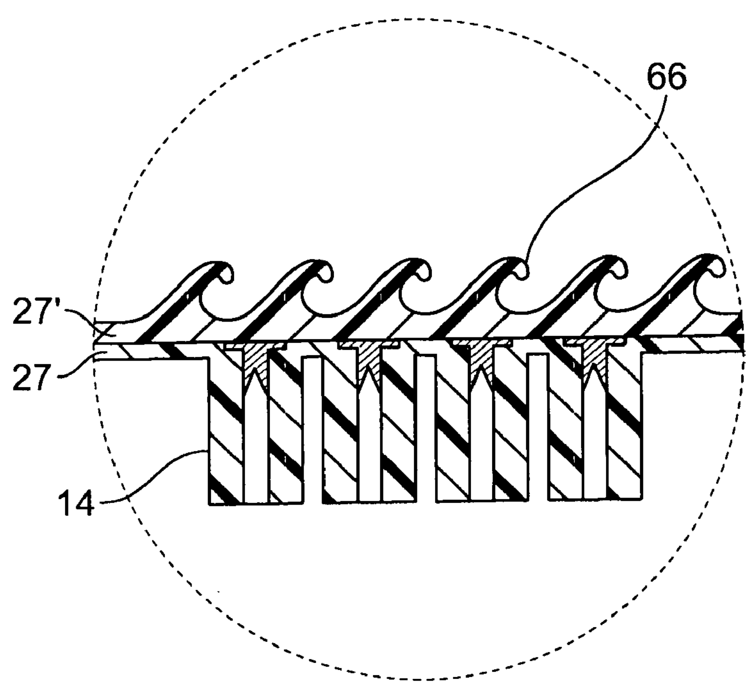
FIG. 4E is a cross-sectional view of the finished flexible circuit shown in FIG. 4, taken along the circuit's centerline.

Referring to FIGS. 4-4E, an alternate manufacturing system 10B includes a roll molding apparatus 11B, a filling station 13B, and a second roll molding apparatus 17. Roll molding apparatus 11B is similar to the roll molding apparatus described above but includes a mold roll 22B with modified mold cavities 26B. Mold cavities 26B are a cylindrical annuli with central pillars 29B that extend from the main body of the mold roll 22B towards and past the adjacent peripheral surface 33 of the mold roll so as to practically or nearly touch opposing pressure roll 24. Pillar damage may be precluded by providing pressure roll 24 with an outer compliant surface, as described in U.S. Pat. No. 5,945,131, the entire contents of which are incorporated herein by reference. Thus, mounting structures 14 have bores 38B that extend from an opening at the end of the mounting structure towards and through resin base 27.

In filling station 13B, dispenser 56 sprays ultraviolet-curable conductive ink 40B onto the face of resin base 27 where the channels 32 are defined. The conductive ink 40B fills the channels 32 and accumulates on the face of the resin base 27. However, because bores 38B extend through mounting structures 14 and into the channels 32, some of the conductive ink 40B enters into the bores of the mounting structures. Doctor blade 58 wipes accumulated ink from the face of resin base 27 while leaving ink in the channels 32 and in the bores 38B as the resin base moves towards and past ultraviolet emitter 64. Ultraviolet emitter 64 radiates ultraviolet light which cures and solidifies the conductive ink 40B to form conductive traces.

Tensioning rolls 70 transfer the resin base 27 from filling station 13B to a second roll molding apparatus 17. The second roll molding apparatus 17 seals the conductive traces in channels 32 with a second layer 27' of resin while molding male fastener elements 66 integrally molded with and extending from the second resin layer. A second extruder 16' feeds a second molten resin 18' into a second nip 20' between the resin base 27 and a second mold roll 22'. A second pressure roll 24' has recesses 68 sized and spaced to receive mounting structures 14 such that resin base 27 can pass through the nip 20' without significantly damaging the mounting structures.

Second mold roll 22' has mold cavities 26' extending into the mold roll that are shaped to form molded hooks 66 with downwardly extending molded ends that are capable of engaging loop material. Pressure in the nip 20' forces second molten resin 18' into the mold cavities 26' to form the molded hooks 66 extending from the second resin layer 27'. Second resin 18' is chosen to be compatible with resin 18 (i.e. resin whose properties are such the two resins 18, 18' permanently adhere to each other). Thus, second resin layer 27' bonds with resin base 27 to form a thermoplastic encapsulation around the conductive traces in channels 32. Although shown as distinct resin layers for purposes of illustration, the bonding process may result in some degree of mixing between the resins.

In this embodiment, the molded hooks are arranged in longitudinally continuous fields of hooks extending along the flexible circuit, such that if the continuous flexible circuit is separated into finite-length strips, each strip will include both mounting structures 14 and fastener elements 66. In alternate embodiments, the molded hooks are arranged in spaced-apart, discrete fields of hooks. The spaced-apart fields of hooks are preferably arranged such that, when the continuous flexible circuit is separated into finite-length strips, each strip includes both mounting structures 14 and fastener elements 66.

In this embodiment, second roll molding apparatus 17' forms molded hooks 66 with downwardly extending molded ends capable of engaging loop material. In alternate embodiments, second roll molding apparatus 17' forms stems whose ends are subsequently deformed (e.g., by applying heat and/or pressure to distal ends of the stems) to produce fastener elements with engageable ends either to engage loops or a second field of male fastener elements.

The hooks 66 integrally molded with and extending from the second resin layer provide a convenient mechanism for mounting the flexible circuit and associated light emitting diode devices to supporting structures. In such applications, a complementary matching fastener material is attached to or is part of the supporting structure. For example, the loop-engagable molded hooks 66 of this embodiment readily attach to strips of loop material adhesively attached to a door frame, to provide emergency exit lighting. In another application, molded hooks 66 are employed to engage fabric curtains or window dressings to provide decorative holiday lighting.

In other embodiments, preformed loop material (rather than roll-molded male fastener elements) is laminated to the resin base to seal the conductive traces and to provide touch fastener elements for attachment of the product to support structures. In some of these embodiments, the resin base is heated such that resin bonds with the loop material (e.g., by entering into pore spaces of the loop material and encapsulating portions of the loop material) such that the loop material and the resin base cooperate to encapsulate the conductors between the resin and loop material.

In this illustrated embodiment, the conductive traces 40 are covered by second resin layer 27' before light emitting diode devices are installed on the flexible circuit. The portions of the conductive material that extend into the bores 38B provide enhanced electrical contact between the pins of light emitting devices and the flexible circuit traces, without requiring that the pins be bent flush with the back surface of the flexible circuit. In some applications, this effect is further enhanced by partially or completely filling the bores with a secondary conductive material (e.g. a conductive adhesive or paste) prior to the insertion of the pins, to promote electrical contact between the pins and the conductive traces.

The systems and methods discussed above produce flexible circuits with mounting structures configured to receive light emitting diode devices. In another embodiment, a manufacturing system and method incorporates actual placement of the light emitting diode devices onto the flexible circuit.

Figure 5:
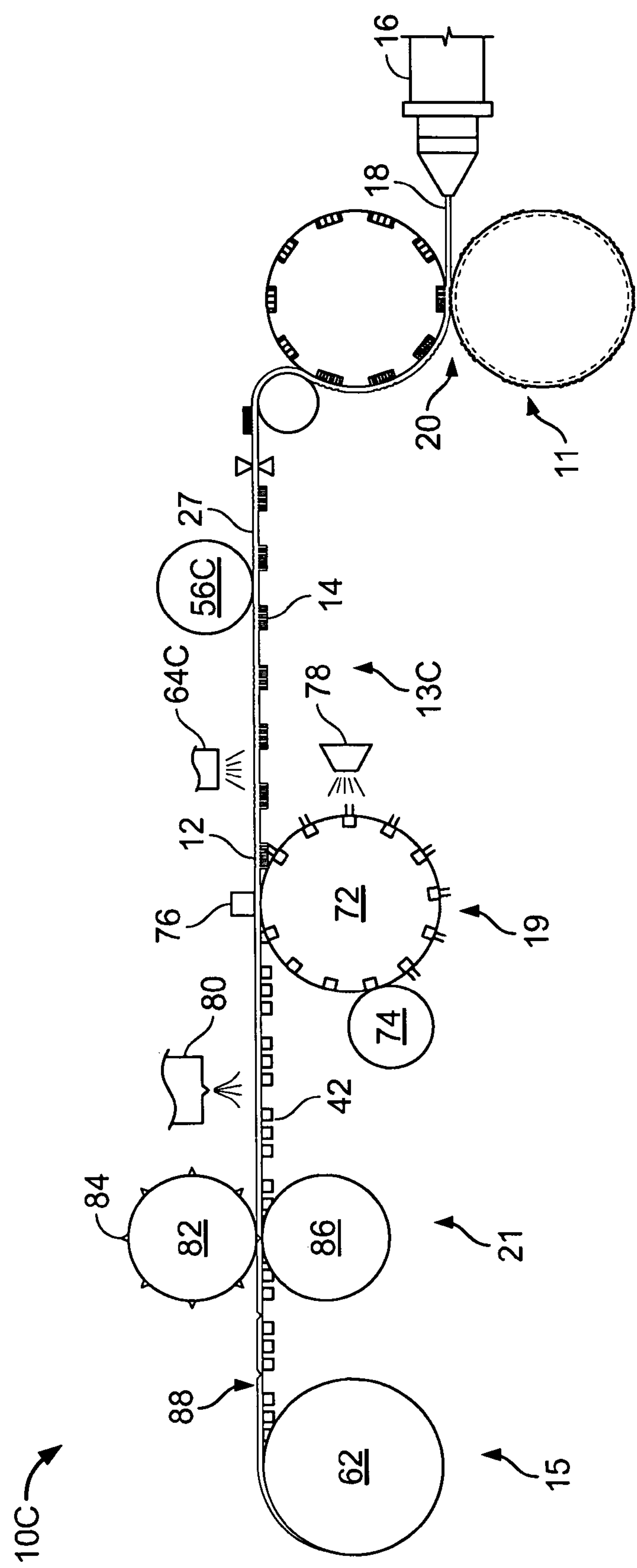
FIG. 5 is a schematic side view of another alternate embodiment of the manufacturing system shown in FIG. 1.

Referring to FIG. 5, a manufacturing system 10C includes a roll molding apparatus 11, a filling station 13C, a storage apparatus 15, a diode device mounting apparatus 19, and a post-processor 21.

In filling station 13C print roller 56C applies a liquid silver composition (e.g., a liquid carrier solution such as EDTA or citric acid containing silver ions) to the channels (not shown) defined in the back surface of resin base 27. The liquid silver composition solidifies under reducing conditions and contains reducing agents (e.g., ascorbic acid or ferrous ammonium sulfate) encapsulated in micro-bubbles. Energy radiated by ultrasonic emitter 64C releases the reducing agents initially contained by the micro-bubbles and solidifies the silver composition. In other embodiments, other liquid compositions with similar properties including, for example, compositions with other metals such as copper or aluminum, are used to fill the channels and form conductive traces on the resin base 27.

Diode device mounting apparatus 19 includes a diode device placement roll 72, a diode device feed roll 74, and a pin folder 76. Feed roll 74 transfers individual diode devices 42 from a feed strip (not shown) into cavities defined in the peripheral surface of diode device placement roll 72. As flexible circuit 12 passes between placement roll 72 and pin folder 76, pins of the diode devices are inserted into interior bores (not shown) of mounting structures 14 and through the conductive traces formed by the solidified silver composition. Pin folder 76 engages the pins of diode devices 42 and folds them so that they are flush against the back side of the flexible circuit at least partially in contact with the conductive traces.

Precise registration or alignment between placement roll 72 and mounting structures 14 of the flexible circuit is provided by placement roll registration. In this embodiment, mounting structures 14 themselves are used as registration features. In other embodiments, mold roll 22 has additional mold cavities specifically configured to mold registration features that are larger than the mounting structures 14 and, thus, are easier to track. Laser registration is also feasible. Suitable registration methods are discussed in U.S. Pat. No. 6,280,670, the entire contents of which are incorporated herein by reference.

Some embodiments include a heater 78 which heats the pins of diode devices 42 prior to the pins being inserted into the interior bores of the mounting structures. As the pins are inserted, heat from the pins softens the resin of mounting structures 14, making it easier for the mounting structures to reform and/or stretch to accommodate rectangular pins in their circular bores. The temperature to which the pins are heated is selected to soften or flow the resin immediately adjacent the pins.

Post-processor 21 seals the back side of the flexible circuit with an insulative coating and scores flexible circuit 12 before it is taken up on storage roll 62. Sealant sprayer 80 dispenses a quick-drying insulative sealant (e.g., epoxy, acrylate, or epoxy-arylate) across the back side of the flexible circuit. This encapsulates both the conductive traces and the pins of the diode devices so as to both physically protect them and electrically isolate them from outside contacts. Cutting roll 82 has ridges 84 to score the back surface of flexible circuit 12 as it passes between the cutting roll and support roll 86. Score lines 88 are located between diode devices 42 at set intervals, to allow users to easily separate the continuous strip of flexible circuit produced by manufacturing system 10C into multiple discrete flexible lighting strips of predetermined length. In other embodiments, the cutting mechanism severs the flexible circuit into discrete lighting strips rather than merely scoring its surface.

Figure 5A:
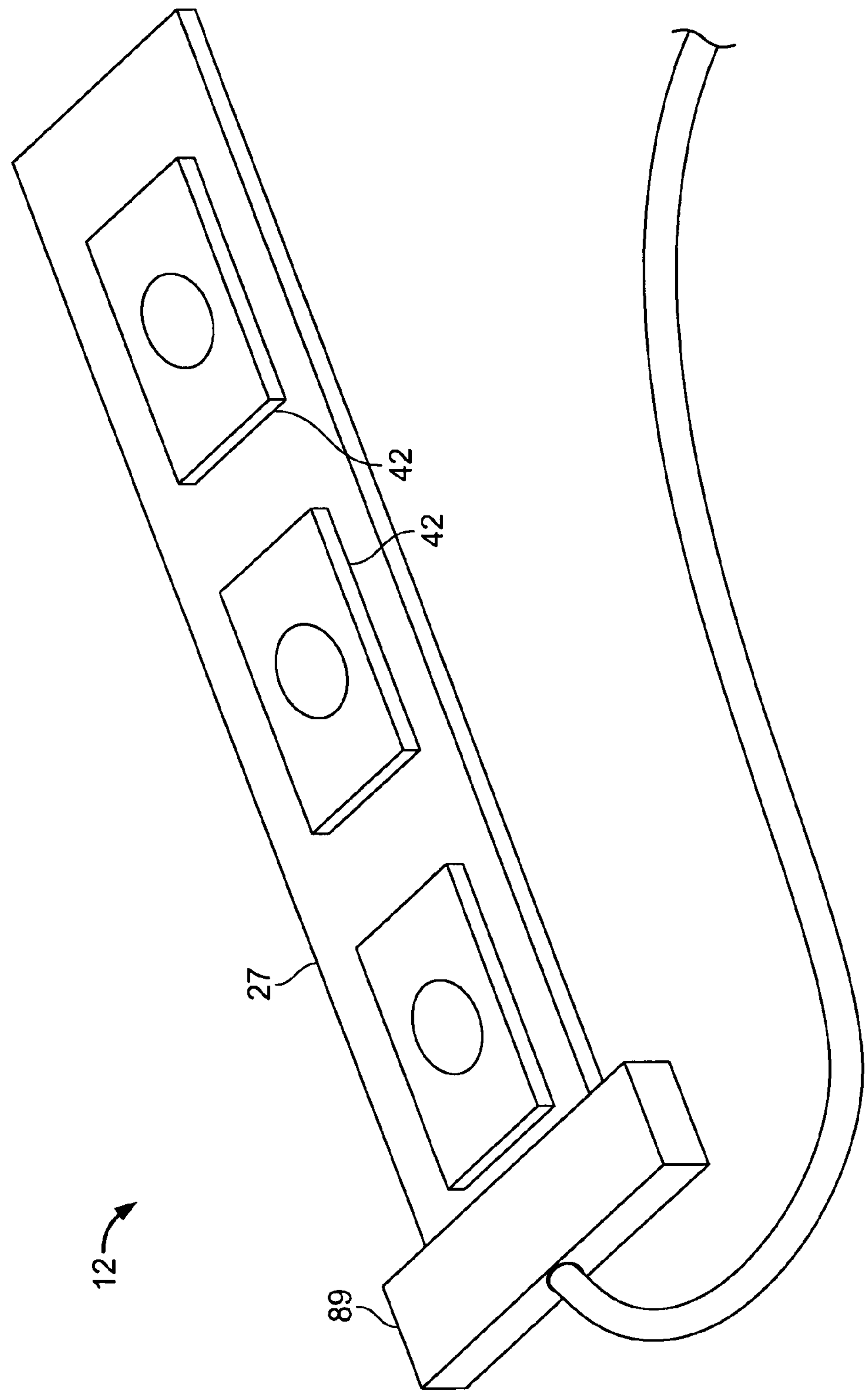
FIG. 5A is a perspective view of a circuit strip produced by the manufacturing system of FIG. 5 and a clamp connector.

Referring to FIG. 5A, a clamping connector 89 (e.g. one with teeth that pierce resin base 27 to contact the conductors) can be attached to each discrete lighting strip to connect the conductors with an electrical power source, signal, and ground.

Figure 6:
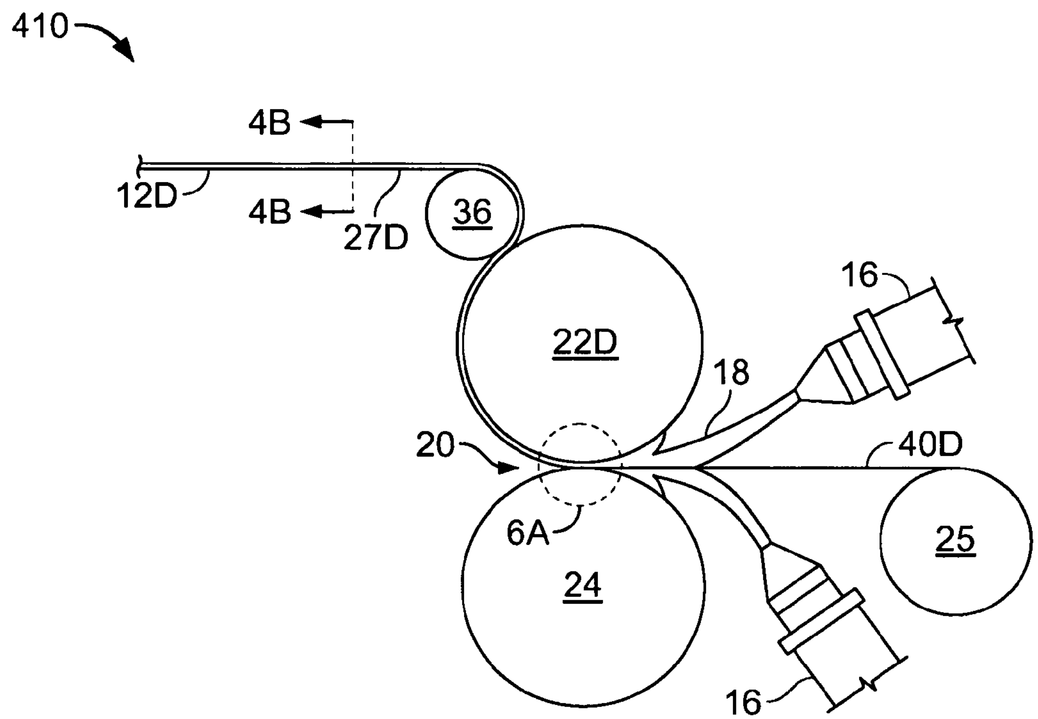
FIG. 6 is a schematic side view of a portion of another alternate embodiment of the manufacturing system shown in FIG. 1.
Figure 6A:
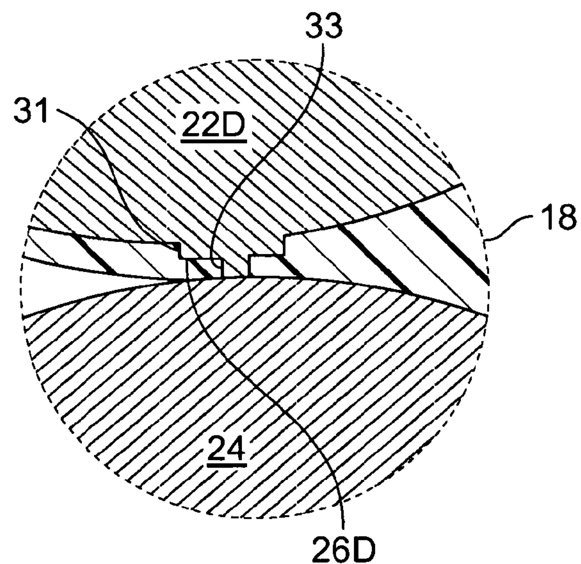
FIG. 6A is a cross-sectional view of the nip of the manufacturing system shown in FIG. 6.
Figure 6B:
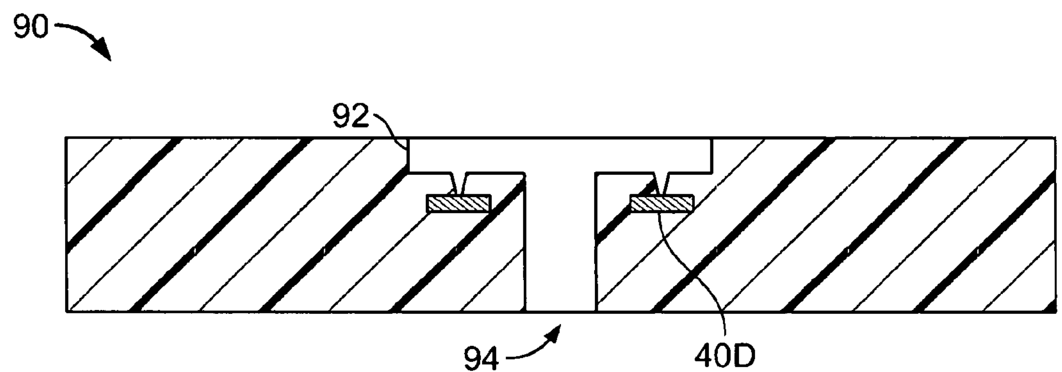
FIGS. 6B-6C are, respectively, cross-sectional views of the flexible circuit shown in FIG. 6 taken perpendicular to the circuit's centerline before and after light emitting diode and heat management devices are installed.
Figure 6C:
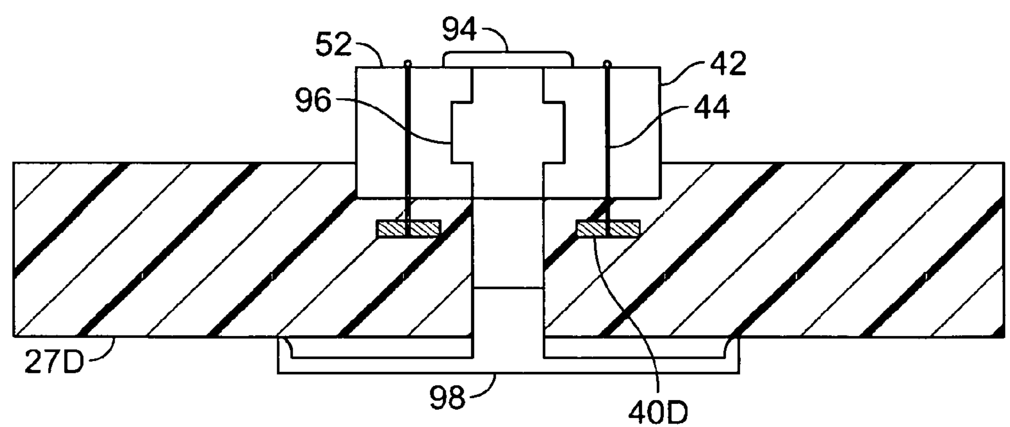

Referring to FIGS. 6-6B, a manufacturing system 10D produces a flexible circuit 12D with mounting receptacles 90 configured to receive both light emitting diode devices 42 and associated heat management devices 98. Manufacturing system 10D includes a roll molding apparatus 11D with nip 20 defined between mold roll 22D and a pressure roll 24. A feed roll 25 introduces parallel strips of conductive foil 40D into nip 20 between two sheets of molten resin 18 provided by two extruders 16. Feed roll 25 is configured to provide conductive foil 40D in pairs of strips, with each pair bracketing a respective row of mold protrusions 26D on the mold roll. In alternate embodiments, feed roll 25 provides wires, rather than strips of conductive foil, that form conductive material extending longitudinally within the resin base.

Mold protrusions 26D extend outward from a peripheral surface of mold roll 22D such that the outer surface of the mold protrusions closely approaches a surface of pressure roll 24. Mold protrusions 26D are spaced and arranged to form mounting receptacles 90 at desired locations on the resulting flexible circuit 12D. In this embodiment, mold protrusions 26D each include an upper portion 31 and a lower portion. Upper portion 31 forms a light emitting diode device receptacle portion 92 of mounting receptacle 90. Light emitting diode device receptacle portion 92 is sized and configured to receive ceramic body 52 of light emitting diode device 42 and includes pin receptacles in the vicinity of the foil strips 40D.

Light emitting diode device 42 includes pins 44 extending through ceramic body 52. Ceramic body 52 supports a diode 94 attached to a heatsink 96 which is substantially contained within the ceramic body. Heatsink 96 transfers heat generated by the operation of diode 94 away from the diode. Light emitting diode device 42 is installed with its pins 44 inserted into the pin receptacles to contact the conductive strips as ceramic body 52 is received in diode device receptacle 92.

The cross-sectional area of lower portions 33 of mold protrusions 27D is smaller than the cross-sectional area of upper portions 31. For the purposes of this description, these cross-sectional areas are defined as the areas of the upper and lower portions in planes parallel to the upper and lower surfaces of the flexible circuit. Lower portion 33 of the mold protrusions forms a heat management device receptacle 93 as part of mounting receptacle 90. Heat management device receptacle 93 is sized and configured to receive a heat management device 98 and is aligned with the position of heatsink 96 of a light emitting diode device 42 received in light emitting diode device receptacle 92. Thus, heat management device 98 can be inserted into heat management device receptacle 94 to contact heatsink 96 and to function to transfer heat from the heatsink through and away from resin base 27D.

In the illustrated embodiment, heat management device 98 is a thermoelectric heat pump based on the Peltier effect, which occurs when a current is passed through two dissimilar metals that are connected to each other at two junctions. The current drives the transfer of heat from one junction to the other: one junction cools off while the other heats up. In this embodiment, the cool junction contacts the heatsink and the hot junction is configured is a radiative structure. In other embodiments, heat management device 98 incorporates a phase change material (e.g. Glauber's Salt or wax). Phase change materials absorb energy when they change state by being heated through a transition temperature, such as in changing from a solid to a liquid.

Figure 7:
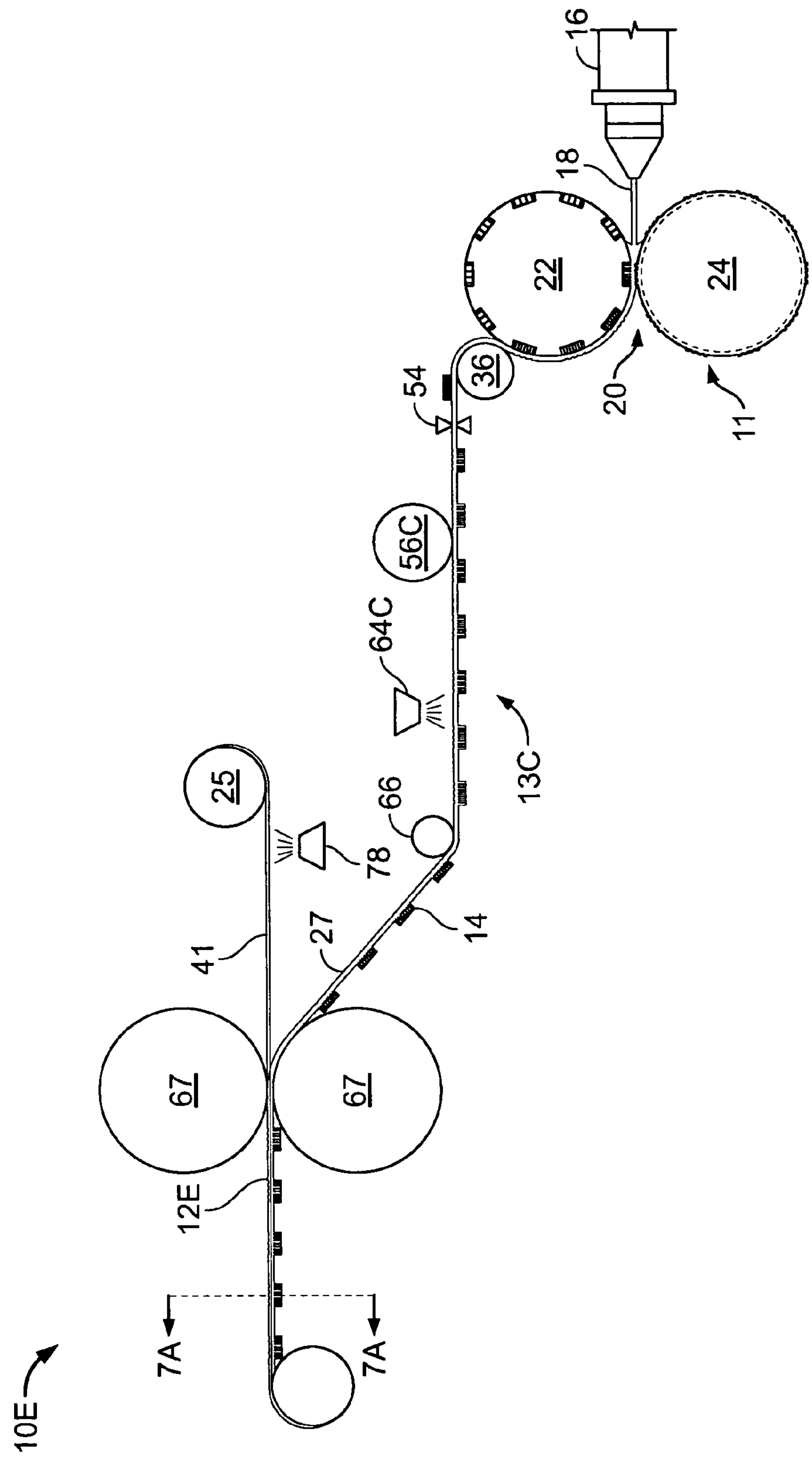
FIG. 7 is a schematic side view of another alternate embodiment of the manufacturing system shown in FIG. 1.
Figure 7A:
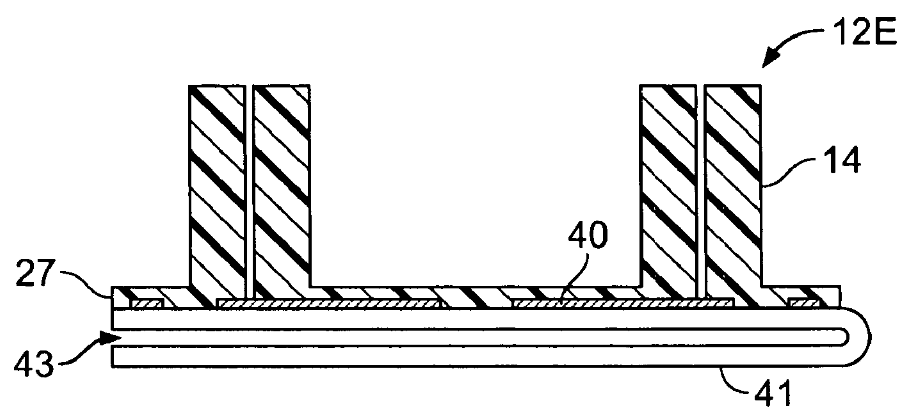
FIG. 7A is a cross-sectional view of the flexible circuit shown in FIG. 7 taken perpendicular to the circuit's centerline.

Referring to FIGS. 7-7A, a similar manufacturing system 10E produces a circuit 12E configured to receive and support light emitting diode devices. In this embodiment, a semi-rigid mounting bracket 41 is laminated to resin base 27 from which mounting structures 14 extend. Roll molding apparatus 11 and filling station 13C are as described in more detail in the discussion of FIG. 5.

Resin base 27 passes around tensioning roll 66 and is fed into a gap between laminating rolls 67. Mounting bracket 41 proceeds from feed roll 25 past flame laminator 78 into the gap between the laminating rolls 67. Flame laminator 78 heats mounting bracket 41 so that pressure in the gap between laminating rolls 67 causes resin base 27 to bond to the mounting bracket. This encloses the conductive traces formed by the solidified conductive ink in the channels.

Figure 7B:
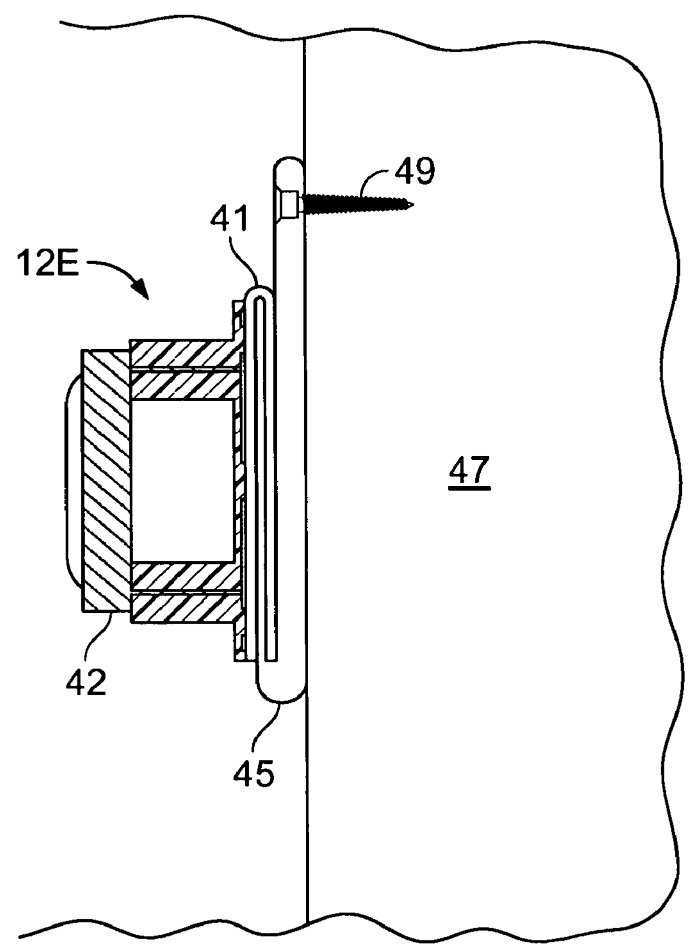
FIG. 7B is a cross-sectional view of the flexible circuit shown in FIG. 7 with a light emitting diode device installed.
Figure 7C:
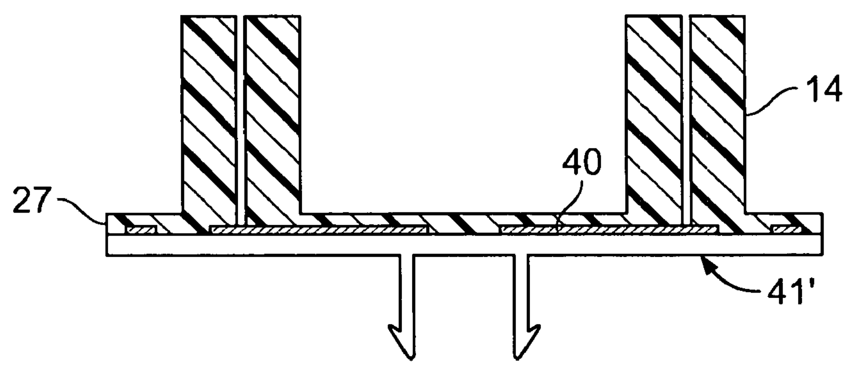
FIG. 7C is a cross-sectional view of the flexible circuit shown in FIG. 7 with an alternative mounting bracket.

Mounting bracket 41 defines a recess 43 that is configured to receive a matching bracket 45 attached to a support. Referring to FIG. 7B, in one example, matching bracket 45 is attached to a wall 47 by a screw 49 and flexible circuit 12E, with attached light emitting diode, is clipped onto the matching bracket. This provides a convenient means for attaching light emitting diode devices to a wall or other support structure. FIG. 7C shows a snap-in mounting bracket 41'. Details of making and using rigid substrates having molded fastener projections are discussed in co-pending application Ser. No. 11/082,384, the entire contents of which are incorporated herein by reference.

Figure 8A:
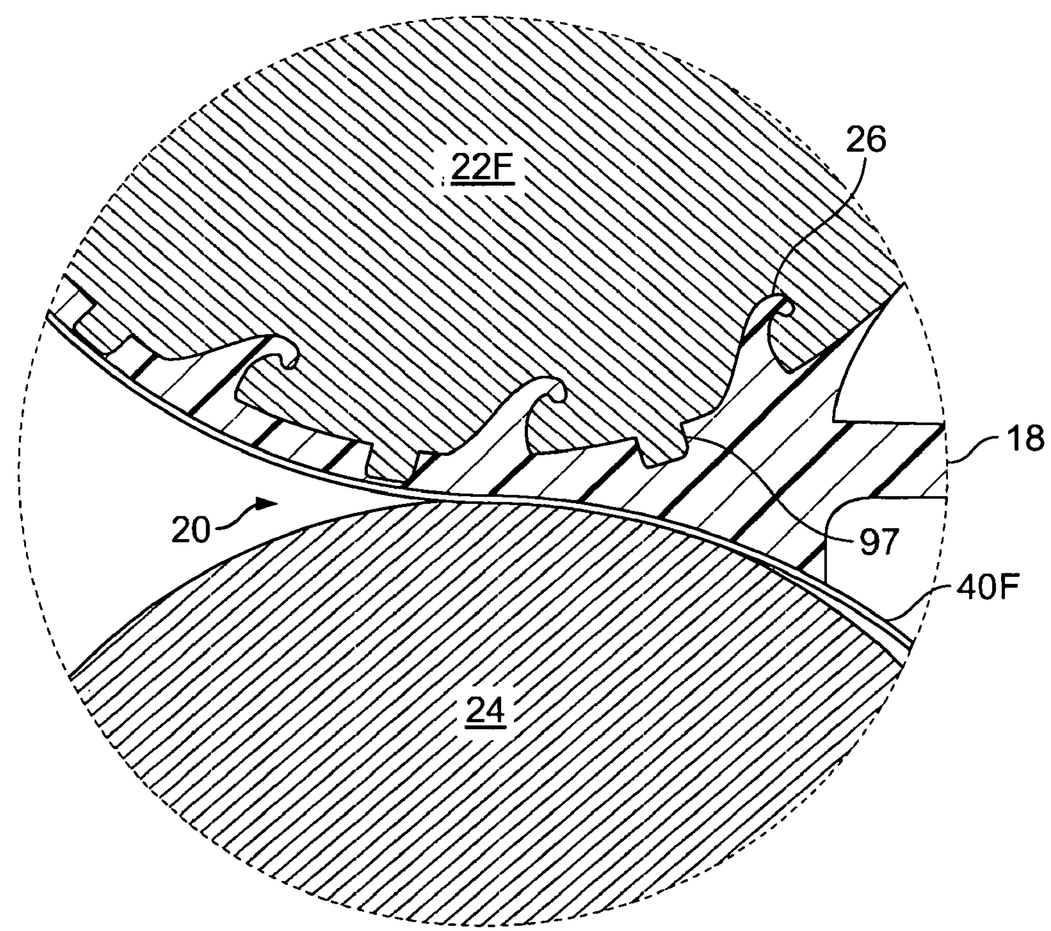
FIG. 8A is a cross-sectional view of flexible circuit shown in FIG. 8 taken along the circuit's centerline.
Figure 8:
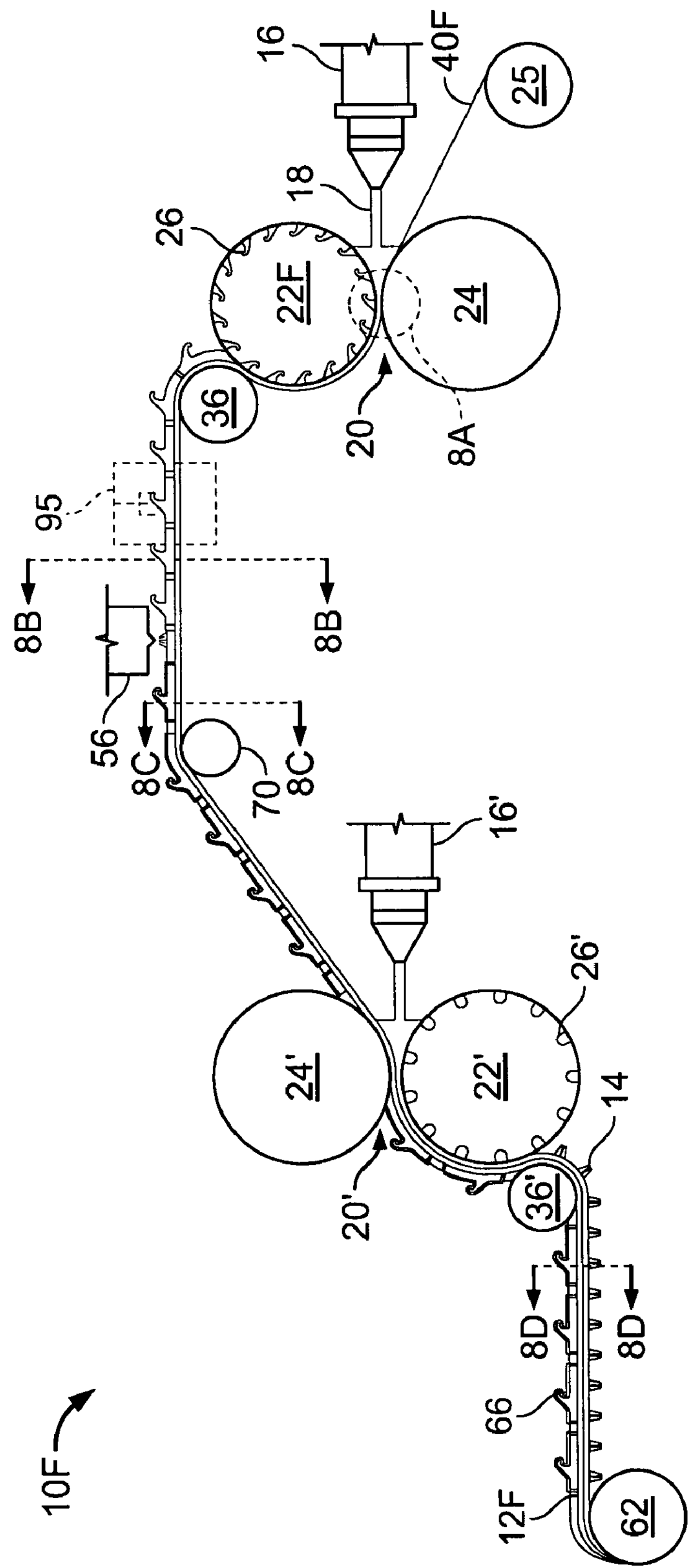
FIG. 8 is a schematic side view of another alternative embodiment of the manufacturing system shown in FIG. 1.

Now referring to FIG. 8, a manufacturing system 10F is used to produce a flexible circuit 12F with mounting structures 14 extending from one side of a resin base 27 and male faster elements 66 extending from the other side of the resin base. Extruder 16 extrudes molten resin 18 into nip 20 defined between a mold roll 22F and pressure roll 24. Feed roll 25 introduces conductive wires 40F into nip 20 along with molten resin 18. Pressure in nip 20 forces molten resin 18 into small mold cavities 26 in the peripheral surface of mold roll 22F. After passing through nip 20, the thermoplastic continues on the surface of rotating temperature controlled mold roll 22 until the resin is sufficiently cooled to enable removal from the mold roll. Resin base 27, integrally molded faster elements 66, and attached wires 40F are removed from mold roll 22 by stripping roll 36.

Now referring also to FIG. 8A, before resin base 27 passes dispenser 56, vias or through-holes 99 are formed extending through the resin base to the wire 40F. In other embodiments (e.g. products in which the longitudinally extending conductors are formed of the conductive foil), vias 99 extend through rather than to wires 40F.

Figure 8B:
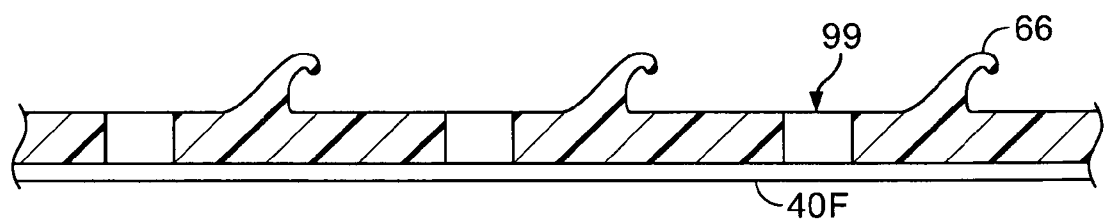
FIG. 8B is a cross-sectional view of the nip of the manufacturing system shown in FIG. 8.

Now referring also to FIG. 8B, in one embodiment, mold roll 22F includes protrusions 97 extending radially outward from the peripheral surface of the mold roll. These protrusions 97 are sized to match the desired thickness of the resin base 27 and, thus, to form vias 99 that extend to wire 40F. An alternate embodiment of manufacturing apparatus 10F includes a piercing station 95 rather than protrusions 97. Piercing station 95 is located between stripping roll 36 and dispenser 56 to form the vias.

Figure 8C:
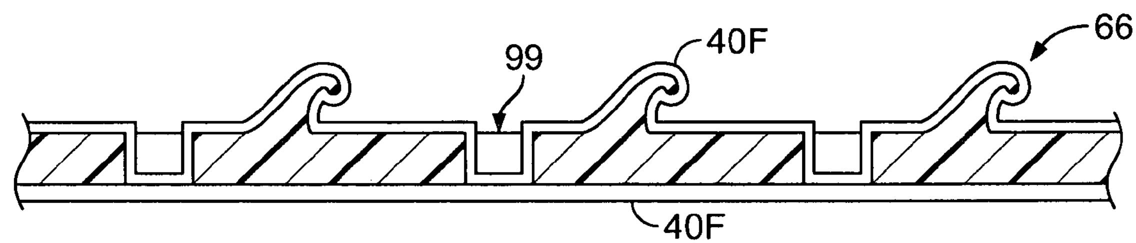
FIGS. 8C-8D are cross-sectional views of the flexible circuit shown in FIG. 8 taken along the circuit centerline after, respectively, a conductive coating is applied and mounting structures are attached.

Now referring also to FIG. 8C, dispenser 56 selectively coats portions of resin base 27, its integrally molded faster elements 66, and the surfaces defining the vias with a second conductive material 40F'. The resulting layer of second conductive material 40F' provide for an electrical connection from the surfaces of faster elements 66 to wires 40F. Thus, coated fastener elements 66 can be used to provide an electrical connection as well as mechanical support.

Figure 8D:
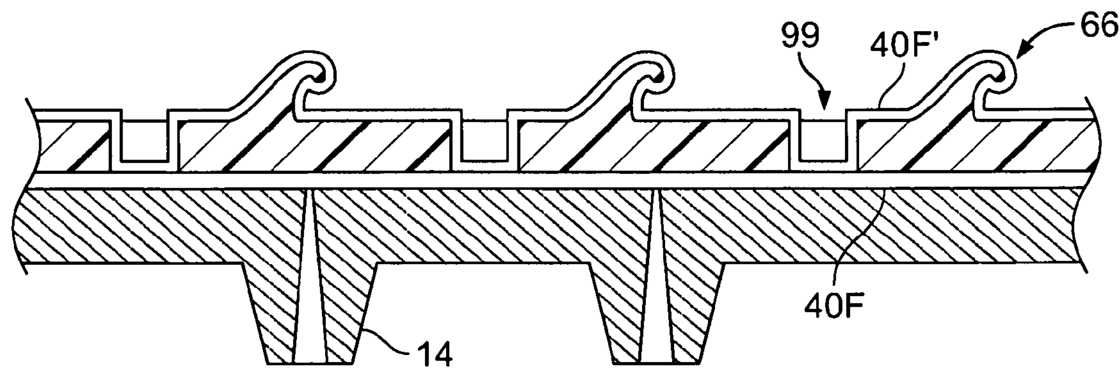

Tensioning roll 70 feed coated resin base 27 into a nip 20' between a second mold roll 22' and a second pressure roll 24' with molten resin 18 extruded by a second extruder 16'. Mold cavities 26' in second mold roll 22' are configured to form mounting structures 14 on a face of resin base 27 opposite the face from which faster elements 66 extend. Now referring also to FIG. 8D, after removal from second mold roll 22' by stripping roll 36', the finished product is collected on storage roll 62.

A number of embodiments of the invention have been described. Nevertheless, it will be understood that various modifications may be made without departing from the spirit and scope of the invention. For example, it will be understood that other types of discrete electrical components, such as integrated circuit chips having pins for mounting the chips onto circuit boards, can be similarly mounted. Also, surface mount components may be carried on flexible circuit strips having electrical traces formed as described herein. Accordingly, other embodiments are within the scope of the following claims.

What is claimed is:

1. For a lighting installation, a flexible circuit comprising:

a roll-molded thermoplastic resin base sheet having an integrally molded mounting structure configured to receive a light emitting diode device, the mounting structure comprising device receptacles integrally molded with and protruding from the base sheet, the receptacles configured to receive pins of the light emitting diode device; and an electrically conductive portion carried by the resin base sheet, the electrically conductive portion positioned for electric connection to conductors of the device.

2. The flexible circuit of claim 1 further comprising a heat management system associated with the resin base sheet and arranged to conduct heat from the base sheet of the device.

3. The flexible circuit of claim 2 wherein the heat management system comprises molded standoffs integral with the base sheet defining air passages for convective heat transfer.

4. The flexible circuit of claim 2 wherein the resin base sheet comprises additives that increase the thermal conductivity of the resin base sheet wherein the additives are chosen from the group consisting of titanium nitride, boron nitride, silica, aluminum oxide, and ceramic particles.

5. The flexible circuit of claim 2 wherein the heat management system comprises radiative structures comprising material with a high thermal conductivity in contact with the light emitting diode device.

6. The flexible circuit of claim 2 wherein the heat management system comprises a peltier junction with a hot-side of greater surface area than an associated cold side.

7. The flexible circuit of claim 1 wherein the device receptacle is a protrusion having pin-receiving passages extending to one of the conductors in the flexible circuit.

8. The flexible circuit of claim 1 wherein the pin receptacles have an adhesive coating.

9. The flexible circuit of claim 1 wherein the pin receptacles have a cross-sectional geometry that is different than an outer surface of the pins they are constructed to receive.

10. The flexible circuit of claim 1 wherein the electrically conductive portions are encapsulated within the base sheet.

11. The flexible circuit of claim 1 further comprising a clamping connector that pierces the resin base sheet to electrically connect the flexible circuit to an electrical source and a ground.

12. The flexible circuit of claim 1 further comprising voids extending through resin base sheet to the electrically conductive portions wherein the voids are coated with an electrically conductive material.

13. The flexible circuit of claim 1 further comprising touch fastener elements attached to the resin basin sheet.

14. The flexible circuit of claim 13 wherein the touch fastener elements comprise male fastener elements with engageable heads.

15. The flexible circuit of claim 13 wherein the touch fastener elements comprise loop-material with surface features encapsulated by resin of the base sheet.

16. The flexible circuit of claim 1 wherein the flexible circuit is a longitudinally extending flexible circuit with multiple mounting structures.

* * * * *

UNITED STATES PATENT AND TRADEMARK OFFICE

CERTIFICATE OF CORRECTION

PATENT NO. : 7,556,405 B2
APPLICATION NO. : 11/495043
DATED : July 7, 2009
INVENTOR(S) : Howard A. Kingsford et al.

It is certified that error appears in the above-identified patent and that said Letters Patent is hereby corrected as shown below:

Claim 13, Col. 14, line 12: after “resin” delete “basin” and insert --base--

Signed and Sealed this

Seventeenth Day of November, 2009

David J. Kappos
*Director of the United States Patent and Trademark Office*